Figure 1:
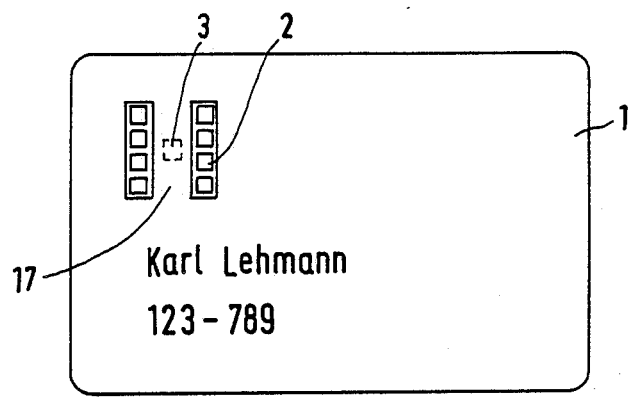

United States Patent [19]

Haghiri-Tehrani

[11] Patent Number: 4,897,534
[45] Date of Patent: Jan. 30, 1990

[54] DATA CARRIER HAVING AN INTEGRATED CIRCUIT AND A METHOD FOR PRODUCING THE SAME

[75] Inventor: Yahya Haghiri-Tehrani, Munich, Fed. Rep. of Germany

[73] Assignee: GAO Gesellschaft fur Automation und Organisation mbH, Fed. Rep. of Germany

[21] Appl. No.: 117,541

[22] Filed: Nov. 6, 1987

[30] Foreign Application Priority Data

Nov. 20, 1986 [DE] Fed. Rep. of Germany ....... 3639630

[51] Int. Cl.$^4$ ............................................. G06K 19/02
[52] U.S. Cl. ..................................... 235/488; 235/492; 361/402
[58] Field of Search ................. 361/401, 402; 235/488, 235/492

[56] References Cited

U.S. PATENT DOCUMENTS

| 4,222,516 | 9/1980 | Badet et al. ......................... 235/492 |
| 4,603,249 | 7/1986 | Hoppe et al. . | |
| 4,717,438 | 1/1988 | Benge et al. ...................... 361/402 X |
| 4,725,924 | 2/1988 | Juan ................................. 235/492 X |
| 4,727,246 | 2/1988 | Hara et al. ....................... 235/492 X |
| 4,733,061 | 3/1988 | Hegi . | |
| 4,754,319 | 6/1988 | Saito et al. ...................... 235/492 X |

FOREIGN PATENT DOCUMENTS 3338597 10/1983 Fed. Rep. of Germany .
2166589A 5/1986 United Kingdom .

Primary Examiner—David L. Trafton
Attorney, Agent, or Firm—Bacon & Thomas

[57] ABSTRACT

The present invention relates to a data carrier having an integrated circuit and to a method for making the same. During production a carrier element equipped with an integrated circuit and contact surfaces is inserted into a recess in the data carrier blank. To allow for the carrier element to be fixed in the recess, said element is underlaid with a melt adhesive film. To protect the integrated circuit from mechanical stresses, a film strip made of a material with high elastic deformability is provided additionally between the circuit and the melt adhesive film.

17 Claims, 6 Drawing Sheets

DATA CARRIER HAVING AN INTEGRATED CIRCUIT AND A METHOD FOR PRODUCING THE SAME

The present invention relates to a data carrier having at least one IC module for processing electrical signals, the IC module being disposed on a substrate which is small compared to the area of the data carrier, communicating via leads with contact elements also provided on the substrate which allow for communication of the IC module with corresponding machines, and being disposed in a recess in a central card layer.

A data carrier of the above-mentioned kind is disclosed, for example, in German "offenlegungsschrift" no. 33 38 597.

In the known data carrier the substrate bearing the IC module, the leads and the contact surfaces is laminated into a multilayer identification card using heat and pressure in such a way that the IC module is located in the interior of the card while the contact surfaces are flush with the surface of the card.

The structural shape used for the integrated circuit in German "offenlegungsschrift" no. 33 38 597 is a so-called micropack. The substrate is generally made of a material (e.g. polyimide) which does not combine with conventional card materials. A melt adhesive or a melt adhesive film is therefore used to interconnect the various synthetic materials using heat and pressure.

Although the melt adhesive film mentioned in German "offenlegungsschrift" no. 33 38 597, being a resilient soft layer in the form of a buffer zone, does tend to protect the circuit, it has turned out in practice that this protective effect does not meet the desired requirements especially in the case of integrated circuits with larger dimensions which, due to their dimensions, are exposed to stronger bending forces during use of the card. One reason for this is that the melt adhesive film must be relatively thin, which necessarily restricts the protective effect as a buffer zone. If the film is thicker, melt adhesive material is inevitably squeezed out at the edge areas of the substrate when the card layers are being pressed together, reaches the surface of the card and impairs the appearance of the card unless it is removed in an additional method step. The thickness of the melt adhesive film is therefore optimized so as to ensure good adhesion in terms of the total surface of the substrate but prevent adhesive material being squeezed out of the open places of the edge area of the substrate. However, this leaves no scope for optimizing the melt adhesive film as a protective buffer zone, using reasonable technical resources.

The invention is therefore based on the problem of proposing a data carrier with an integrated circuit not involving any additional technical resources, in which even a circuit of larger dimensions can withstand the mechanical stresses in daily use.

This problem is solved by the features stated in the main claim.

In a preferred embodiment of the invention, the various layers of a data carrier and the substrate bearing the IC module are pressed together using heat and pressure. The substrate bearing the IC module, the leads and the contact surfaces is embedded in the laminate in such a way that the IC module is disposed in the interior of the data carrier while the contact surfaces are located on the surface thereof. In order to connect the substrate with the materials of the data carrier, a melt adhesive film is used. In addition a film strip is provided as a separate element between the substrate and the melt adhesive film, said strip being approximately as wide and at least as long as the IC module and being made of a material having higher deformability than the surrounding materials of the data carrier.

The use of this film strip makes it possible to provide an effective buffer zone for circuits with larger dimensions as well without having to adapt the thickness of the melt adhesive film to the size of the module. The melt adhesive film and the film strip forming the protective buffer zone can be optimized in their respective functions independently of each other. Whereas the melt adhesive film is selected so as to assure good adhesion of the elements to be connected but prevent adhesive material being squeezed out at the open places in the edge area of the substrate, the film strip, being a separate eement, can be optimized in its dimensions and physical properties so as to protect even larger IC modules effectively from mechanical stresses.

In spite of these advantages, the use of the film strip does not involve any appreciable additional effort. The integrated circuits suitable for incorporation in identification cards are generally supplied by the semiconductor producer already mounted on film strips. The incorporation in identification cards of substrates appropriately punched out of the film strips, as described in German "offenlegungsschrift" no. 33 38 597, necessitates, as mentioned, an adhesive layer, for example a melt adhesive film, The substrate and melt adhesive film are preferably combined prior to the card production, the substrate and melt adhesive film each being wound off its own roll and brought together and bonded using heat and pressure, for example, in a roll laminating means. It does not require any additional effort in terms of process technology to dispose an additional film strip on the IC module since this strip, also wound off a roll, can be applied to the substrate film bearing the integrated module simultaneously with the melt adhesive film. The additional film strip is enclosed between the substrate and melt adhesive film. The additional material used per substrate or data carrier is also negligible in view of the total costs of a data carrier.

In accordance with a further embodiment of the invention, the film strip is made of a material that not only has high elastic deformability but also has a lower softening temperature than the materials of the data carrier and furthermore does not bond during the laminating process with the materials (such as the melt adhesive film substrate film and also the IC module) in the surroundings. Since the film strip is thus plastically deformable and does not bond with the surrounding materials during lamination, the IC module and leads can be embedded free from tension, on the one hand, and move within certain limits inside the laminate if the data carrier is strongly deformed during use, on the other hand, thereby evading the stresses caused by the deformation in the laminate. A material having the above-mentioned properties is polyethylene, for example.

Figure 2:
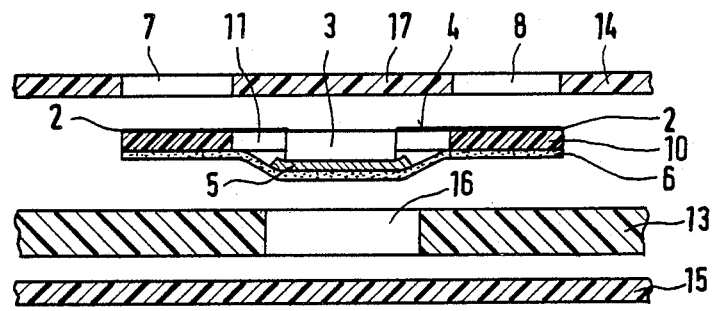

Further advantages and developments of the invention can be found in the subclaims and in the following description of some embodiments with reference to the figures, in which FIG. 1 shows an identification card from the top, FIG. 2 shows a cross-sectional view of the identification card of FIG. 1 prior to lamination.

Figure 3:
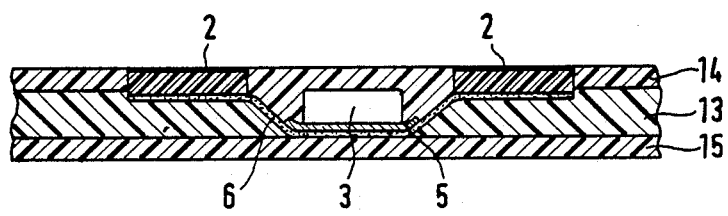
Figure 4:
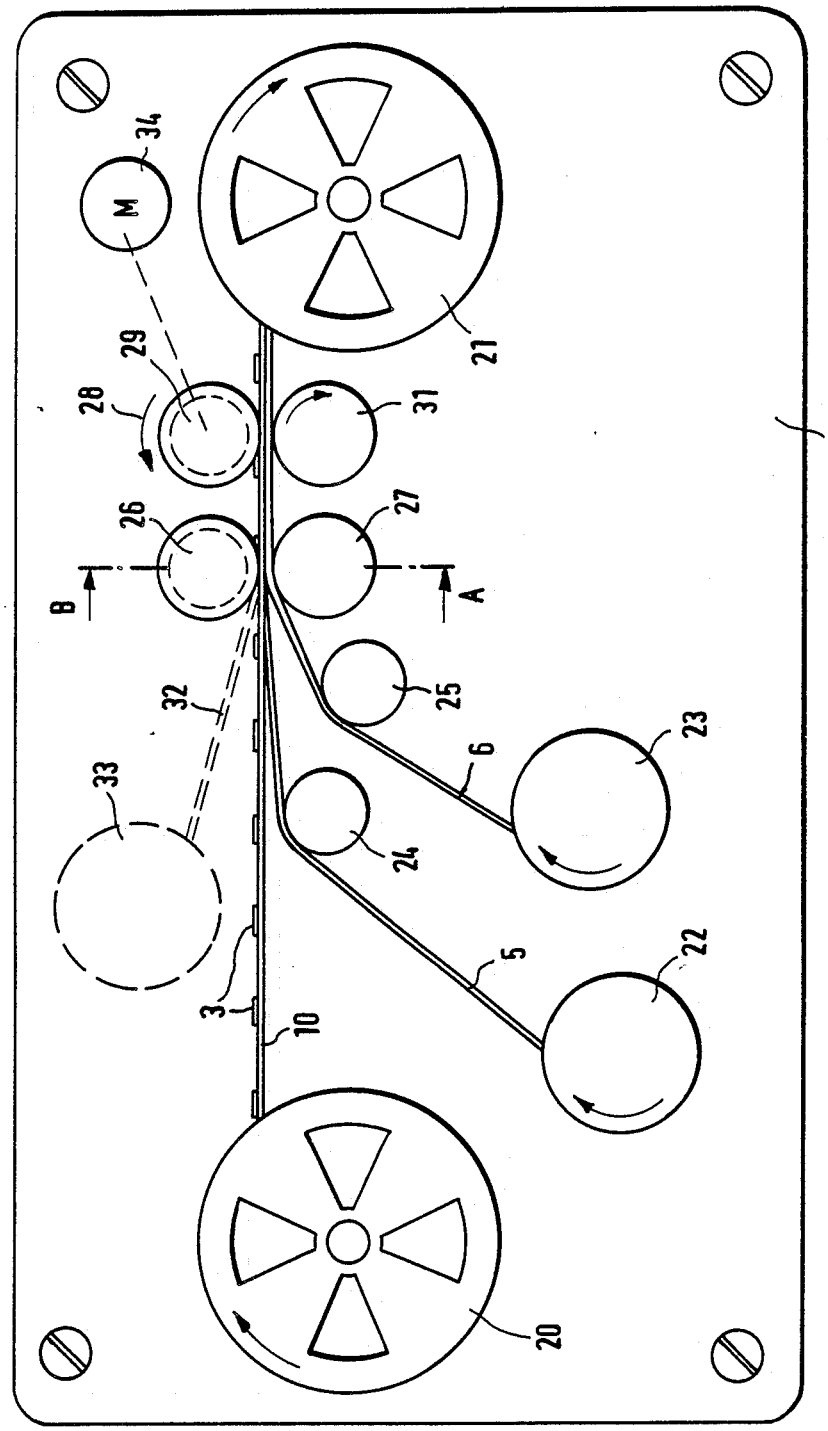
Figure 5:
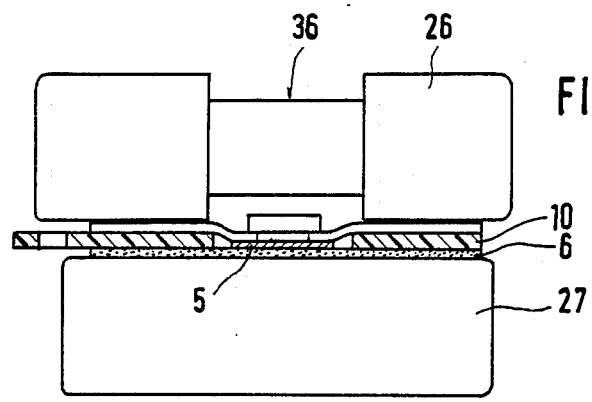
Figure 6:
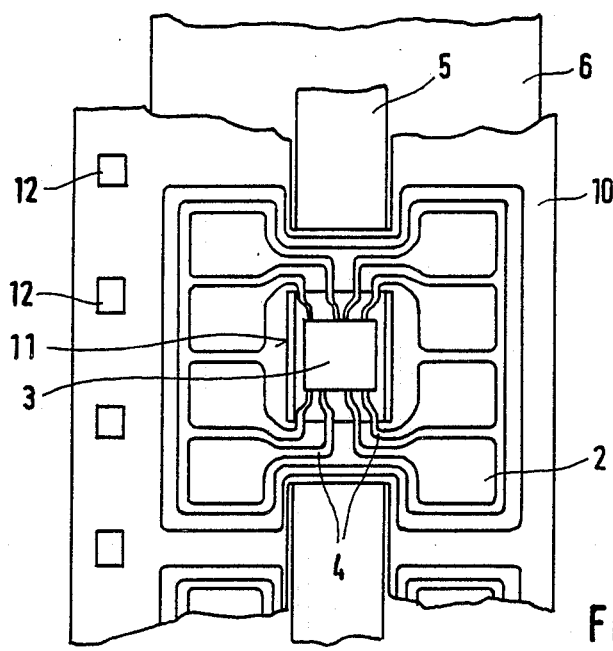
Figure 7:
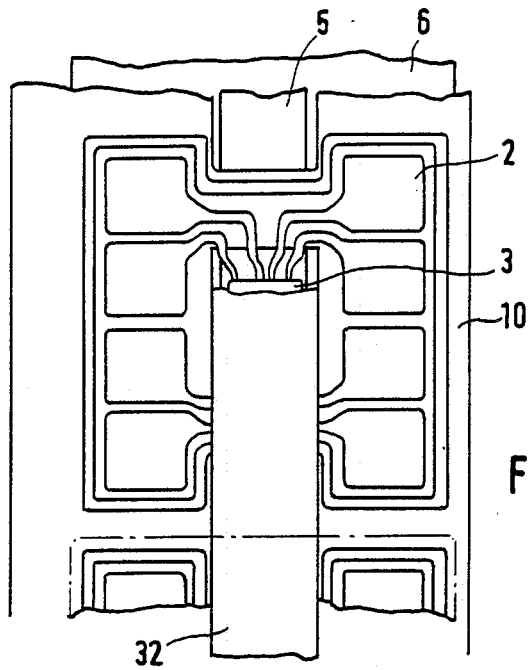
Figure 8:
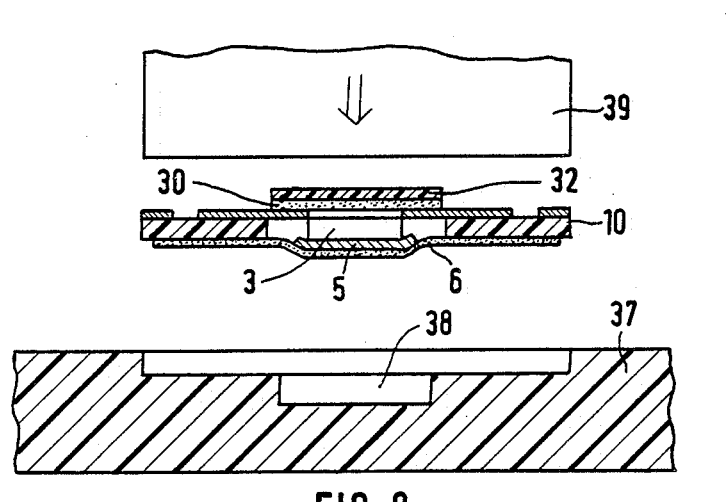
Figure 9:
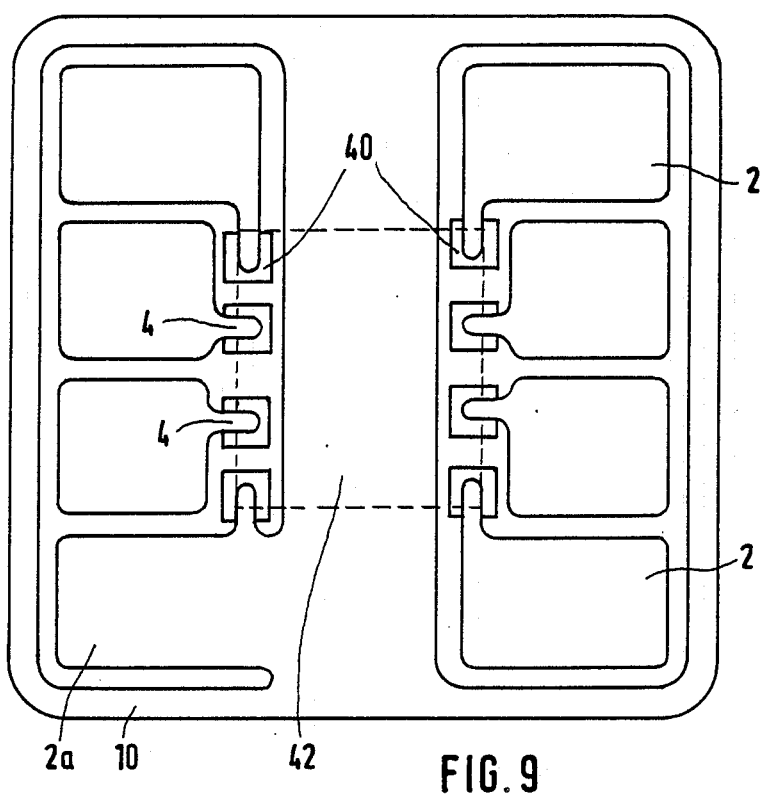
Figure 10:
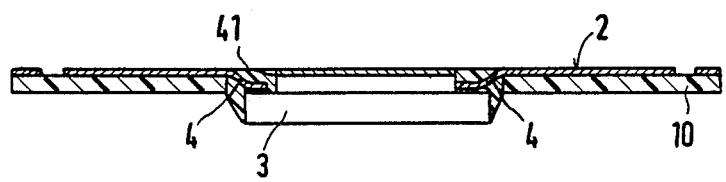
Figure 11:
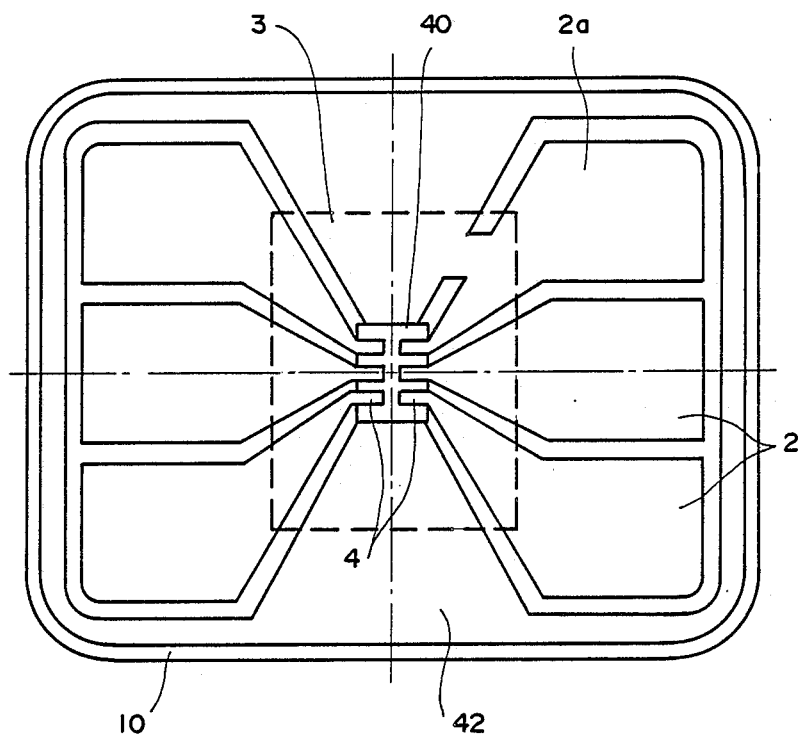
Figure 12:
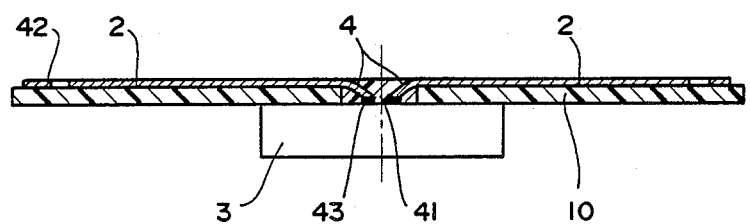

FIG. 3 shows a cross-sectional view of the identification card of FIG. 1 after lamination, FIG. 4 shows an apparatus for making a carrier element having film strips, FIG. 5 shows a cross-sectional view of the apparatus of FIG. 4 along line A–B, FIG. 6 shows the carrier elements made in the apparatus of FIG. 4 from the top, FIG. 7 shows a further embodiment of a carrier element made in the apparatus of FIG. 4, FIG. 8 shows an identification card and a carrier element before the individual elements are joined together, FIGS. 9 and 10 show an embodiment of a carrier element from the top and in cross-section, and FIGS. 11 and 12 show a further embodiment of a carrier element from the top and in cross-section.

FIG. 1 shows an identification card 1 having an IC module 3 embedded in the card core, said module being electrically connected via leads with outer contact surfaces 2 located on the card surface. In a preferred embodiment the card consists of three layers (see FIGS. 2 and 3), a card cover layer 13 with an opening 16 for IC module 3 and two cover films 14, 15, cover film 14 having two recesses 7 and 8. The recesses are dimensioned so that each one can take up a group consisting of four contact surfaces in the embodiment shown. Bottom cover film 15 seals off the identification card on the back. Between core layer 13 and cover layer 14 there is the so-called carrier element consisting of IC module 3, leads 4, contact surfaces 2 and carrier substrate 10. IC module 3 is connected in a recess 11 of substrate 10 with the ends of leads 4 protruding into the recess, and is held in the window only by the attachment of the leads with the corresponding terminals of the module. This type of attachment or positioning of semiconductor elements with leads etched out of a conductive coating of the substrate has been known for some time and proved its usefulness in practice (see also Siemens-Bauteile-Report 16 (1978), no. 2, pp. 40-44).

To allow the carrier element to be fixed in the card structure, said element is underlaid with a melt adhesive film 6. This melt adhesive film serves to combine substrate 10, which is made of polyimide, for example, with the material of the identification card (for example PVC) so that these layers bond when pressed together using heat and pressure.

According to the invention, a film strip 5 is provided between melt adhesive film 6 and IC module 3, said strip having at least the dimensions of the IC module and covering its bottom area. The film strip is made of a material having high elastic deformability, so that the IC module and leads move within certain limits inside the card laminate when the card is strongly deformed and evade the stresses caused by the deformation in the card laminate. The material of the film strip preferably has not only high elastic deformability but also a low softening point compared to the card materials used. This makes the material plastically deformable during lamination, allowing for the IC module and leads to be embedded free from tension. It has also been shown that the protective effect can be further improved by selecting a material, e.g. polyethylene, which not only has a low modulus of elasticity compared to PVC, for example [E (PE)=200−300N/mm$^2$, E (PVC)=3000N/mm$^2$] and a lower softening point, but also does not bond during the laminating process with the materials in the surroundings, such as melt adhesive film 6, substrate 10 and also IC module 3. This further improvement in the protective effect for the circuit is presumably due to the movability of the film strip within the card, which is not impaired by any adhesion to adjacent elements.

The advantageous embedding technique described can be realized without any appreciable additional effort if the carrier element is already equipped with a film strip before being embedded in an identification card.

A corresponding apparatus for making such carrier elements is shown in FIG. 4. The apparatus shown very schematically here essentially comprises a so-called roll laminating means consisting of a heating roll 26 and a pressure roll 27, as well as a driving means consisting of a drive roll 29 connected to a motor 34, and a mating roll 31. The motor rotates drive roll 29 in the direction of arrow 28. The film strips to be connected are wound off supply rolls 20, 22, 23 and wound onto a storage roll 21 after passing through the roll laminating and driving means. These elements and others specifically explained below are all attached to a mounting plate 35.

The raw product for making carrier elements is a substrate film 10 on which IC modules 3 are mounted at regular intervals by the so-called TAB technique (tape automated bonding). Film 10 equipped with IC modules 3 is wound on a roll 20 in the usual way. Melt adhesive film 6 is directed from a supply roll 23 via a deflection roll 25 together with substrate film 10 between heating and pressure rolls 26, 27. Between heating roll 26 and pressure roll 27, melt adhesive film 6 is bonded with substrate film 10 under the action of heat and pressure. As FIG. 5 shows in a cross-sectional view, heating roll 26 is provided with a recess 36 running around the middle thereof, so that when substrate film 10 equipped with IC modules 3 passes through the modules are free from mechanical and thermal stresses. Melt adhesive film 6 is combined with substrate film 10 along the edge areas extending in the direction of transport. Film strip 5 embedded according to the invention between the IC module and melt adhesive film 6 is wound off a supply roll 22 and directed via deflection roll 24 in the area of the heating and mating rolls between melt adhesive film 6 and substrate film 10. This film strip does not bond with the surrounding materials but is only enclosed in the position determined by its introduction by the compound arrangement of melt adhesive film 6 and substrate film 10. After melting, the film laminate runs through drive and mating rolls 29, 31. Here, the melt adhesive film is again pressed onto the substrate film with simultaneous cooling and thereby fixed definitively. The finished laminate is finally wound onto storage roll 21.

The end product is shown from the top in FIG. 6. The figure shows substrate film 10 with contact surfaces 2 located on its surface, and leads 4 which lead to IC module 3 located in a recess. Along a side edge substrate film 10 is provided with perforations 12 which may also be used in the apparatus described above to transport substrate film 10 accurately during the various processing steps. FIG. 6 indicates the dimensions and the position of film strip 5 embedded between melt adhesive film 6 and substrate film 10. Film strip 5 is approximately as wide as the IC module but extends over the entire length of substrate film 10. Leads 4 extending into recess 11 to IC module 3 are preferably directed so as to be also located on passing film strip 5 and thus protected accordingly.

As shown, film strip 5 protecting IC module 3 and leads 4 can be placed between melt adhesive film 6 and substrate film 10 without any additional effort in terms of process technology.

In the identification card shown in FIGS. 1 and 3, the various card layers are bonded together using heat and pressure. During the laminating process the substrate is embedded with all components in the card laminate in such a way that the IC module is located approximately in the middle of the card laminate while the contact surfaces are flush with the card surface. Web 17 made of the material of cover film 14 and extending between the contact areas ensures, among other things, that the IC module is pressed into recess 16 of core layer 13, as also described in German "offenlegungsschrift" no. 33 38 597.

In other known incorporating techniques, the substrate is inserted, for example, into a prepared recess in a finished identification card. Since no further cover layer is provided in this case, the substrate must be covered and thereby protected in a different way in the area of the IC module on the side where the contact surfaces are located if the so-called micropack form is to be retained. A further embodiment of the invention therefore consists in providing a film strip 32 in the middle of substrate 10, as shown in FIGS. 7 and 8. This film strip can also be provided on the substrate using the apparatus shown in FIG. 4 in a simple manner similar to that described above. For this purpose one need only provide a further supply roll 33 (shown by dotted lines in FIG. 4) from which an appropriate film strip 32 is wound and directed between heating and pressure rolls 26, 27. To allow for film strip 32 to be attached to substrate film 10 said strip can be provided with an adhesive layer 30. Film strip 32 is preferably adapted to the particular card material, being made, for example, of PVC which is dyed or printed in accordance with the particular card design.

To allow for the latter substrate to be incorporated in an identification card, finished card 37 is provided with a recess 38 adapted to the dimensions of the substraate (FIG. 8). The substrate is connected with card body 37 using a heating die 39, for example. Due to film strip 32 passing through the middle of the substrate, the IC module is protected against outer influences in the middle of the card body laminate, while the contact surfaces are readily accessible on the card surface.

FIGS. 9 and 10 show an embodiment of a substrate suitable for incorporation in identification cards,, in which IC module 3 is not located in a recess in substrate 10 but covered by material of the substrate on the side opposite the contact surfaces (FIG. 10). The substrate has a plurality of recesses 40 through which leads 4 run which connect IC module 3 electrically with contact surfaces 2. The entire substrate is provided with a conductive coating 42 out of which contact surfaces 2 with the leads leading to the recesses are etched. The contact surfaces are therefore completely surrounded by conductive material which is preferably connected to ground contact 2a to protect the circuit from electrostatic charges in a manner known as such.

The cross-sectional view of FIG. 10 indicates that recesses 40 are filled with a suitable resin 41 to protect the point of connection between the end of the particular lead and the IC module against environmental influences and mechanical stresses.

In the embodiment shown, a recess 40 is associated with each terminal of the module and thus with each lead. It is also possible to direct two or more leads jointly through one recess to the terminals of the module, depending on the paths of the leads.

The substrate shown in FIGS. 9 and 10 involves the advantage that it can be used in identification cards without additional measures using the incorporation techniques described above while maintaining the time-tested TAB technique (see also Siemens-Bauteile-Report). Using the incorporation technique explained in connection with FIGS. 1 to 3, middle web 17 of the cover film can be omitted. Using the incorporation variant explained in connection with FIG. 8, film strip 32 can be dispensed with.

To incorporate the substrate, a melt adhesive film can again be used. An additional film strip having the properties described above may also be used with this substrate between the melt adhesive film and the IC module.

Finally, FIGS. 11 and 12 show a further embodiment of a carrier element for integrated circuits, which is essentially characterized in that terminals 43 of integrated circuit 3 are not located in the edge area of the chip surface, as is usual and shown in FIGS. 10 and 11.

In the carrier element shown by way of example in FIGS. 11 and 12, terminals 43 of the circuit, to which the ends of leads 4 are directed through a recess 40 in film 10, are located in the center of the circuit area. This embodiment involves several advantages.

It is technically easier to handle the filling of cavity 40 with a suitable resin or silicon because the volume of the cavity to be filled varies only within narrow tolerances.

If the circuit is pressed against film 10 during filling so that the circuit closes off recess 40 on one side, a cavity 40 having a predefined volume exists which can be filled evenly in a simple manner in the production process once the dosage is set. Even if there is a small gap between the circuit and the film, which is also filled in with the selected resin or silicon during the filling process, it has no adverse effect on the dosage, since the amount flowing in here is small and varies insignificantly in different carrier elements.

If a transparent resin or silicon gel is selected to fill in the cavity, an irregular closure of the recess on the surface of the carrier element does not disturb the appearance either.

The arrangement of terminals 43 of module 3 shown in the figures also involves the advantage that the soldered or welded connections between the ends of leads 4 and terminals 43 of the module, due to their central position, are subjected to less mechanical load with respect to any tensile or gravitational forces when the carrier element is bent than if the terminals are arranged decentrally in the edge area of the circuit.

Finally, the shown placement of terminals 43 on the circuit involves the advantage that the lead routing and thus also the bonding tool can be retained unchanged for circuits of different sizes.

I claim:

1. A data carrier having at least one IC module for processing electrical signals, the IC module being disposed on a substrate which is small compared to the area of the data carrier, communicating via leads with contact elements also provided on the substrate which allow for communication of the IC module with corresponding machines, and said IC module being disposed in a recess in a card layer, characterized in that the IC module (3) is covered on the side facing the interior of the card by a film strip (5) which is approximately as wide and at least as long as the IC module (3) and made of a material having higher deformability than the surrounding materials (13, 14, 15, 37) of the data carrier.

2. A data carrier according to claim 1, characterized in that the film strip (5) is made of a material which not only has high elastic deformability but also has a lower softening temperature than the materials of the data carrier and does not bond with the materials (13, 14, 15, 37) in the surroundings.

3. A data carrier according to claim 2, characterized in that the film strip (5) is made of polyethylene.

4. A data carrier according to claim 1, characterized in that the substrate (10) is provided on the side opposite the contact surfaces (2) with a melt adhesive film (6) and the film strip (5) is enclosed between the IC module (3) and the melt adhesive film (6).

5. A carrier element for incorporation in a data carrier, comprising a substrate bearing an IC module connected via leads with contact surfaces provided on the substrate, characterized in that the IC module (3) is underlaid with a film strip (5) which is as wide and at least as lone as the IC module (3) and has high deformability compared to the materials usually used in making data carriers.

6. A carrier element according to claim 5, having a melt adhesive film disposed on the surface of the substrate opposite the contact surfaces, characterized in that the film strip (5) is provided in the area of the IC module (3) between the IC module (3) and the melt adhesive film (6) and extends along the entire length of the substrate.

7. A carrier element according to claim 6, characterized in that the IC module (3) is disposed in a recess (11) in the substrate (10) and the leads (4) extending to the IC module (3) are directed in the area of the recess (11) in such a way as to be underlaid with the film strip (5).

8. A carrier element according to claim 7, characterized in that a further film strip (32) is provided on the surface of the substrate (10) bearing the contact surfaces (2), said film strip being approximately as wide and at least as long as the recess (11) and extending across the substrate (10) between the parallel rows of contact surfaces (2).

9. A carrier element for incorporation in data carriers, comprising a substrate bearing an IC module connected via leads with contact surfaces provided on the substrate, characterized in that the IC module (3) is disposed on one side of the substrate (10) and in that the leads (4) extend from the terminals (43) of the IC module through openings (40) in the substrate (10) and are connected with the contact surfaces (2) located on the side of the substrate (10) opposite the IC module (3).

10. A carrier element according to claim 9, characterized in that the terminals (43) of the IC module (3) are placed thereon in such a way that the openings (40) in the substrate (10) are covered by the IC module on the side opposite the contact surfaces (2).

11. A carrier element according to claim 10, characterized in that the terminals (43) are disposed in the center of the area of the IC module (3).

12. A method for making a carrier element for incorporation in a data carrier, characterized by the method steps of: making available a substrate film provided with an IC module, said IC module connected via leads extending through a recess in the substrate film to contact surfaces provided on the substrate film; supplying a film strip (5) with high deformability and a width corresponding approximately to that of the IC module on the side of the substrate film opposite the contact surfaces and in the area of the the IC module; supplying a melt adhesive film on the side of the substrate film opposite the contact surfaces so that the melt adhesive film covers both the film strip and a portion of the surface of the substrate film; and fixing the film strip by combining the melt adhesive film with the substrate film, the melt adhesive film being combined with the film strip and the substrate film at least in the edge of the IC module.

13. A method according to claim 12, characterized in that an additional film strip is provided on the side of the substrate film having the contact surfaces, said film strip being approximately as wide as the recess in the substrate film and extending between neighboring contact surfaces.

14. An apparatus for making a carrier element, characterized by: a laminating and driving means for transporting and combining a substrate film (10) provided with an IC module with at least one film strip; a first means (20) for presenting the substrate film to the laminating and driving means; a second means (22, 24) for supplying a first film strip (5) to the substrate film in the area of the laminating and driving means; a third means (23, 25) for supplying a second film strip (6) to the substrate film in the area of the laminating and driving means; and a means (21) for intermediately storing the substrate film after combining the substrate film with at least one film strip.

15. An apparatus according to claim 14, characterized in that the second means comprises a supply roll (22) and a deflection roll (24) for supplying the first film strip to the laminating and driving means.

16. An apparatus according to claim 14, characterized in that the third means comprises a supply roll (23) and a deflection roll (25) for supplying the second film strip to the laminating and driving means.

17. An apparatus according to claim 14, further characterized by a fourth means (33) for directing a third film strip (32) to the substrate film.

* * * * *